United States Patent [19]

Okamura

[11] Patent Number: 5,478,609
[45] Date of Patent: Dec. 26, 1995

[54] SUBSTRATE HEATING MECHANISM

[75] Inventor: Nobuyuki Okamura, Kawasaki, Japan

[73] Assignee: Canon Kabushiki Kaisha, Tokyo, Japan

[21] Appl. No.: 95,184

[22] Filed: Jul. 23, 1993

[30] Foreign Application Priority Data

Jul. 23, 1992 [JP] Japan ................... 4-197147

[51] Int. Cl.$^6$ ................... C23C 14/00
[52] U.S. Cl. ................... 427/572; 427/573; 118/719; 118/724; 118/725; 118/728; 204/298.07; 204/298.09; 204/192.12
[58] Field of Search ................... 118/719, 724, 118/725, 728; 204/298.07, 298.09, 192.12; 427/572, 573

[56] References Cited

U.S. PATENT DOCUMENTS

| | | | |
|---|---|---|---|
| 4,951,603 | 8/1990 | Yoshino | 118/725 |
| 5,033,407 | 7/1991 | Mizuno | 118/725 |
| 5,113,929 | 5/1992 | Nakagawa | 118/725 |
| 5,180,432 | 1/1993 | Hansen | 118/725 |
| 5,188,058 | 2/1993 | Nakai | 118/725 |
| 5,252,131 | 10/1993 | Kiyama | 118/725 |
| 5,284,521 | 2/1994 | Atetagawa | 118/725 |
| 5,332,442 | 7/1994 | Kubodera | 118/725 |

*Primary Examiner*—Richard Bueker
*Attorney, Agent, or Firm*—Fitzpatrick, Cella, Harper & Scinto

[57] ABSTRACT

A substrate-heating mechanism has a heat source for heating a substrate for heating a substrate face side reverse to a film formation face in a film deposition on the film formation surface of the substrate held on a substrate holder in a vacuum chamber, the mechanism comprises a second vacuum chamber for maintaining vacuum the substrate face reverse to the film formation face.

4 Claims, 3 Drawing Sheets

SUBSTRATE HEATING MECHANISM

BACKGROUND OF THE INVENTION

1. Field of the invention

The present invention relates to a mechanism for heating a substrate, particularly to a mechanism for heating a substrate employed for thin film formation and thin film processing in a thin film-forming process such as CVD or sputtering of a semiconductors.

2. Related Background Art

In formation of a thin film such as of a semiconductor, heating of a substrate is indispensable for obtaining higher quality of the thin film.

FIG. 3 roughly illustrates construction of a sputtering apparatus for film formation having a conventional substrate-heating mechanism.

The film-forming sputtering apparatus 100 as shown in FIG. 3 is of a parallel-plate type, and comprises a vacuum chamber 111 electrically grounded, a target 112 placed in the vacuum chamber, a magnetron electric field-applying means (above the target 112 in FIG. 3) constituted of a permanent magnet 1131 and a yoke 1132, a first earth shield 114 provided around the magnetron electron field-applying means, a DC power source 116 for applying DC voltage through a low-pass filter 115 to the target 112, a high-frequency power source 118 for applying a high-frequency voltage through a matching circuit 117 to the target 112, a substrate holder 119 for holding the substrate 101 such that the film formation face is confronted to the target 112, and a second earth shield 120 provided around the substrate holder 119; and, outside the vacuum chamber 111, a substrate-heating mechanism constituted of a substrate-heating platinum heater 130 placed at the side of the substrate 101 reverse to the film formation face (hereinafter referred to as "back face") and a reflecting plate 131 placed at the side of the heater 130 reverse to the substrate 101.

A gaseous starting material is introduced through a gas introduction valve 121. The vacuum chamber 111 is evacuated through an evacuation opening 122 connected to an evacuation pump (not shown in the drawing). Prior to film formation, the vacuum chamber is evacuated to the ultra-high vacuum range ($1.0 \times 10^{-8}$ torr or higher vacuum). For this purpose, a metal gasket is employed for sealing the flange portions in the vacuum chamber 111, and Kovar connection is employed for insulating seal. A cooling means is provided at the side of the yoke 1132 reverse to the permanent magnet 1131 to cool the magnetron magnetic field-applying means.

The substrate 101 in the sputtering apparatus 100 is heated at the back side by conduction and radiation of heat generated by the substrate-heating platinum heater 130 through the substrate holder 119.

In the above-described conventional film-forming sputtering apparatus 100, when the film is formed at a high temperature, above 450° C., of the substrate 101, the substrate-heating platinum heater 130 is required to be heat-resistant to such a high temperature to increase the current flow for larger heat generation. However, even with increased capacity of the substrate-heating platinum heater 130, high heating efficiency is not achievable disadvantageously because the substrate 101 is heated from the outside of the vacuum chamber 111 through the vacuum-maintaining portion (namely the substrate holder 119). Further, the increase of the capacity of the substrate-heating platinum heater 130 results not only in higher temperature of the substrate 101 but also in increase of the amount of gas released from the portion of the substrate holder 119 to cause contamination of the film formed on the substrate 101 with impurity.

As one method to solve such problems, the substrate-heating platinum heater 130 is placed in the vacuum chamber 111, thereby eliminating the interposed article such as substrate holder 119 as practiced in MBE (molecular beam epitaxy). With this method, however, the vacuum chamber 111 is heated by thermal radiation from the substrate-heating platinum heater 130, and deposition of a film by diffusion of the gaseous material on the substrate-heating platinum heater 130 causing disadvantages electric breakdown. No report has been presented on a method of decreasing the released gas in the case where the substrate-heating platinum heater 130 is placed in the vacuum chamber 111.

In another method, the substrate is locally heated by direct irradiation of light or the like from the film formation face of the substrate. With this method, film deposition occurs on a portion other than the substrate. When infrared light, near-infrared light, or visible light is used for the heating, high heating efficiency is not achievable because the introduction of light from the film formation side of the substrate will cause film deposition on the lamp itself or light introduction window for projecting light from the outside.

SUMMARY OF THE INVENTION

An object of the present invention is to provide a substrate-heating mechanism in a film formation process, which is capable of preventing contamination of a formed film with a gas released on heating of a substrate and capable of efficiently heating the substrate.

Another object of the present invention is to provide a substrate-heating mechanism comprising a second vacuum chamber for keeping vacuum the substrate face reverse to the film formation face, whereby any gas released from the substrate-heating mechanism is emitted into the second vacuum chamber and is eliminated therefrom to the outside and the contamination of the formed film with the released gas is prevented.

A further object of the present invention is to provide a substrate-heating mechanism comprising a cooling means for cooling the substrate holder, thereby decreasing the amount of the gas which is released from the substrate holder by the temperature rise.

DESCRIPTION OF THE PREFERRED EMBODIMENT

The present invention is a substrate-heating mechanism, so that a film is deposited on a film formation face of a substrate held on a substrate holder in a vacuum chamber, which has a heat source for heating a substrate for heating a substrate face side reverse to a film formation face, and the mechanism comprises a second vacuum chamber provided for maintaining vacuum on the substrate face reverse to the film formation face thereof.

In the present invention, the substrate-heating mechanism of the present invention may further comprise a cooling means for cooling the substrate holder.

The aforementioned heat source for heating a substrate may be a heater for heating a substrate provided in the second vacuum chamber.

Further in the present invention, the second vacuum chamber may have a light-introducing window and the heating source for a substrate may be a light source placed outside the second vacuum chamber to project light onto a face of the substrate reverse to the film formation face thereof through a light-introduction window provided on a wall of the second vacuum chamber.

The substrate-heating mechanism of the present invention, which has a second vacuum chamber for maintaining vacuum on the face of the substrate reverse to the film formation face thereof, allows the released gas from the heating mechanism to emit in the second vacuum chamber and to be removed to the outside of the system. Thus, the released gas is prevented from diffusing to the film formation space in the first vacuum chamber.

The substrate-heating mechanism of the present invention may comprise a cooling means for cooling the substrate holder in the vicinity of the substrate-heating source. By this means the released gas caused by temperature rise of the substrate holder is reduced.

The embodiment of the present invention is specifically described by reference to the drawings.

Figure 1:
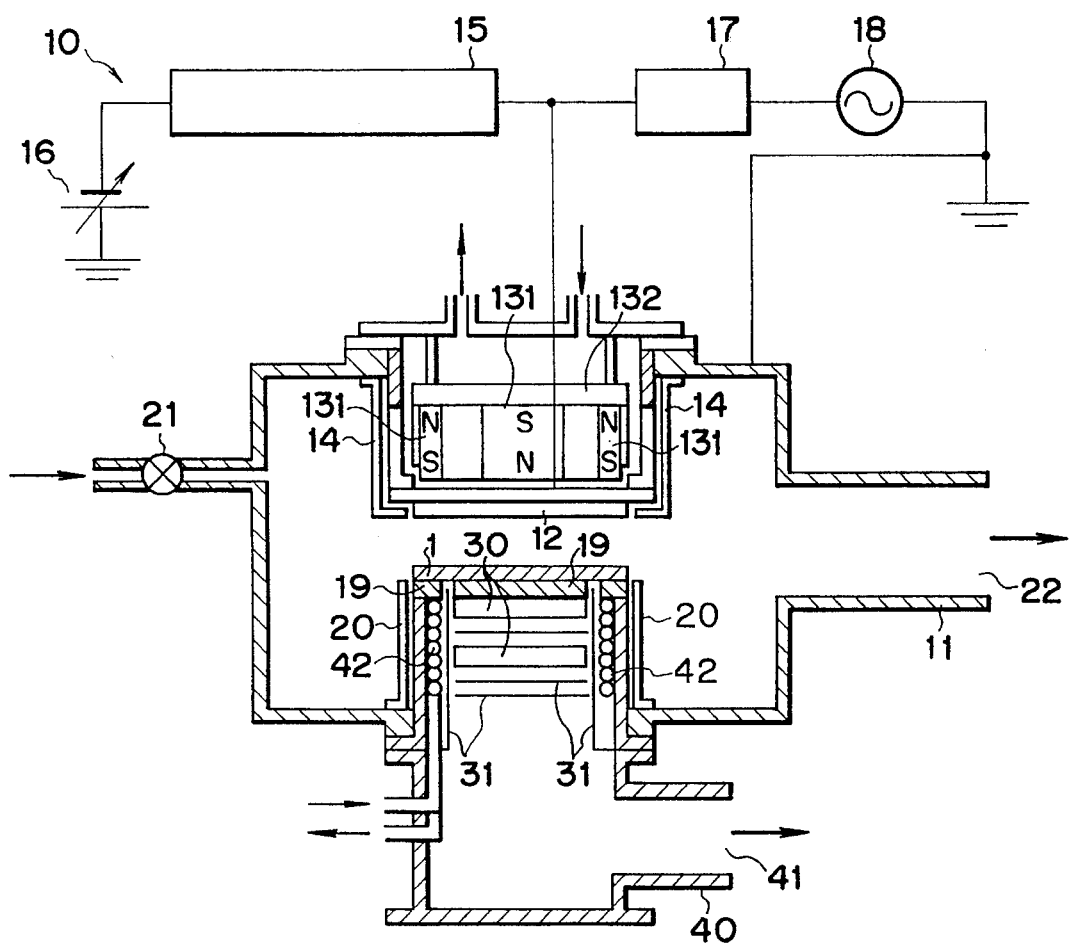
FIG. 1 illustrates roughly a film-forming sputtering apparatus provided with a substrate-heating mechanism of the present invention.

FIG. 1 illustrates roughly a sputtering apparatus equipped with a substrate-heating mechanism of the present invention.

In FIG. 1, numeral 14 is a first earth shield; 15, a low-pass filter; 17, a matching circuit; 20, a second earth shield; 31, a reflecting plate; 131, a permanent magnet; and 132, a yoke.

The sputtering apparatus 10 shown in FIG. 1 differs from the conventional sputtering apparatus shown in FIG. 3 in that the substrate-heating mechanism has a second vacuum chamber for maintaining vacuum at a face (hereinafter referred to "back face") of the substrate 1 reverse to a film-formation face, and substrate holder-cooling tubing 42 for circulation of cooling medium (e.g., cooling water) which is placed in the space of the second vacuum chamber. A substrate holder-cooling tubing 42 serves as a substrate holder-cooling means for cooling the substrate holder 19. The substrate-heating platinum heater 30 serves as a substrate-heating source.

The steps are described on film formation onto the substrate 1 by use of the sputtering apparatus 10.

The substrate 1 is placed in a vacuum chamber 11 and is held by the substrate holder 19 such that the film formation face of the substrate is confronted with a target 12. Then the vacuum chamber 11 is evacuated by means of an evacuation pump (not shown in the drawing) connected to the vacuum chamber 11 through an evacuation opening 22. The second vacuum chamber 40 is also evacuated by means of a second evacuation pump (not shown in the drawing) connected to the second vacuum chamber 40 through a second evacuating opening 41. During evacuation of the second vacuum chamber 40, voltage is applied to the substrate-heating platinum heater 30 from a voltage source (not shown in the drawing) to heat the substrate-heating platinum heater 30. At the time when the pressure of the second vacuum chamber 40 reaches $1 \times 10^{-8}$ torr or higher vacuum, a cooling medium is circulated through the substrate holder-cooling tubing 42. Subsequently, a gas-introducing valve 21 is opened to introduce gaseous argon into the vacuum chamber 11, and high frequency voltage and DC voltage are applied to the target 12 respectively from a target high-frequency power source 18 and a target DC power source 16 to generate plasma in the vacuum chamber 11. Thus, film is formed on the substrate 11.

In the film-forming sputtering apparatus 10, since a gas released from the substrate holder 19 is exhausted through the second evacuating opening 41 to the outside of the system, the released gas does not diffuse into the film formation space in the vacuum chamber 11, and contamination of the formed film with the gas released by heating of the substrate is inhibited. Further, the amount of the gas released from the substrate holder 19 during the heating of the substrate 1 is reduced by cooling of the substrate holder 19.

Figure 2:
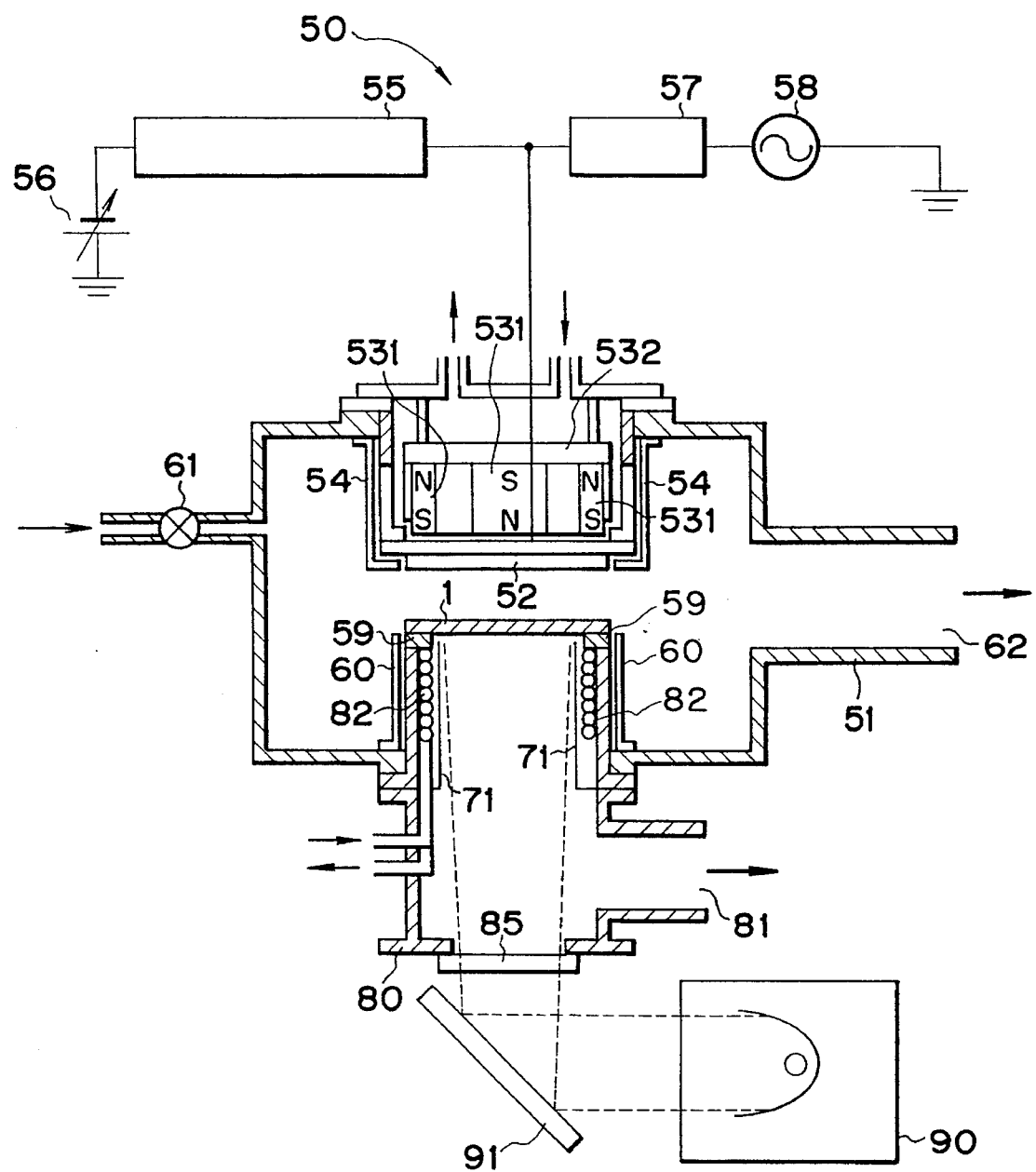
FIG. 2 illustrates roughly another film-forming sputtering apparatus provided with a substrate-heating mechanism of the present invention.

FIG. 2 illustrates another sputtering apparatus equipped with a substrate-heating mechanism of the present invention.

In FIG. 2, numeral 54 is a first earth shield; 55, a low-pass filter; 57, a matching circuit; 60, a second earth shield; 71, a reflecting plate; 531, a permanent magnet; and 532, a yoke.

The film-forming sputtering apparatus 50 in FIG. 2 differs from the film-forming apparatus 10 in FIG. 1 in that the second vacuum chamber 80 has a light-introducing window 85, and the substrate-heating mechanism employs as a substrate-heating source a lamp light source 90 provided outside the second vacuum chamber 80 for heating the substrate 1 by projecting light through a light-introducing window 85 onto the face of the substrate 1 reverse to the film formation face thereof (back face).

The steps are described on film formation onto the substrate 1 by use of the sputtering apparatus 50.

The substrate 1 is placed in the vacuum chamber 51 and is held by the substrate holder 59 such that the film formation face of the substrate is confronted with the target 52. Then the vacuum chamber 51 is evacuated by means of an evacuation pump (not shown in the drawing) connected to the vacuum chamber 51 through an evacuation opening 62. The second vacuum chamber 80 is also evacuated by means of a second evacuation pump (not shown in the drawing) connected to the second vacuum chamber 80 through a second evacuating opening 81. During the evacuation of the second vacuum chamber 80, the lamp light source 90 is turned on, and the light emitted from the lamp light source 90 is reflected by a reflection mirror 91 (upward in the drawing) and is introduced through the light introduction window 85 onto the back face of the substrate 1. At the time when the pressure of the second vacuum chamber 80 reaches $1 \times 10^{-8}$ torr or higher vacuum, a cooling medium is circulated through the substrate holder-cooling tubing 82. Subsequently, a gas-introducing valve 61 is opened to introduce argon gas into the vacuum chamber 51, and high frequency voltage and DC voltage are applied to the target 52 respectively from a target high-frequency power source 58 and a target DC power source 56 to generate plasma in the vacuum chamber 51. Thereby film is formed on the substrate 1.

In the film-forming sputtering apparatus 50, the amount of the gas released from the substrate holder 59 is decreased by cooling the substrate holder 59 during the heating of the substrate 1, and since a gas released from the substrate holder 59 is exhausted through the second evacuation opening 81 to the outside of the system, the film deposition onto the light-introducing window 85 is inhibited, and heating is conducted efficiently. Furthermore, maintenance of the apparatus is facilitated by use of sealing material such as an O-ring as a vacuum sealing of the light-introducing window 85.

A laser beam source may be used as the substrate-heating source in place of the lamp light source in this embodiment.

Figure 3:
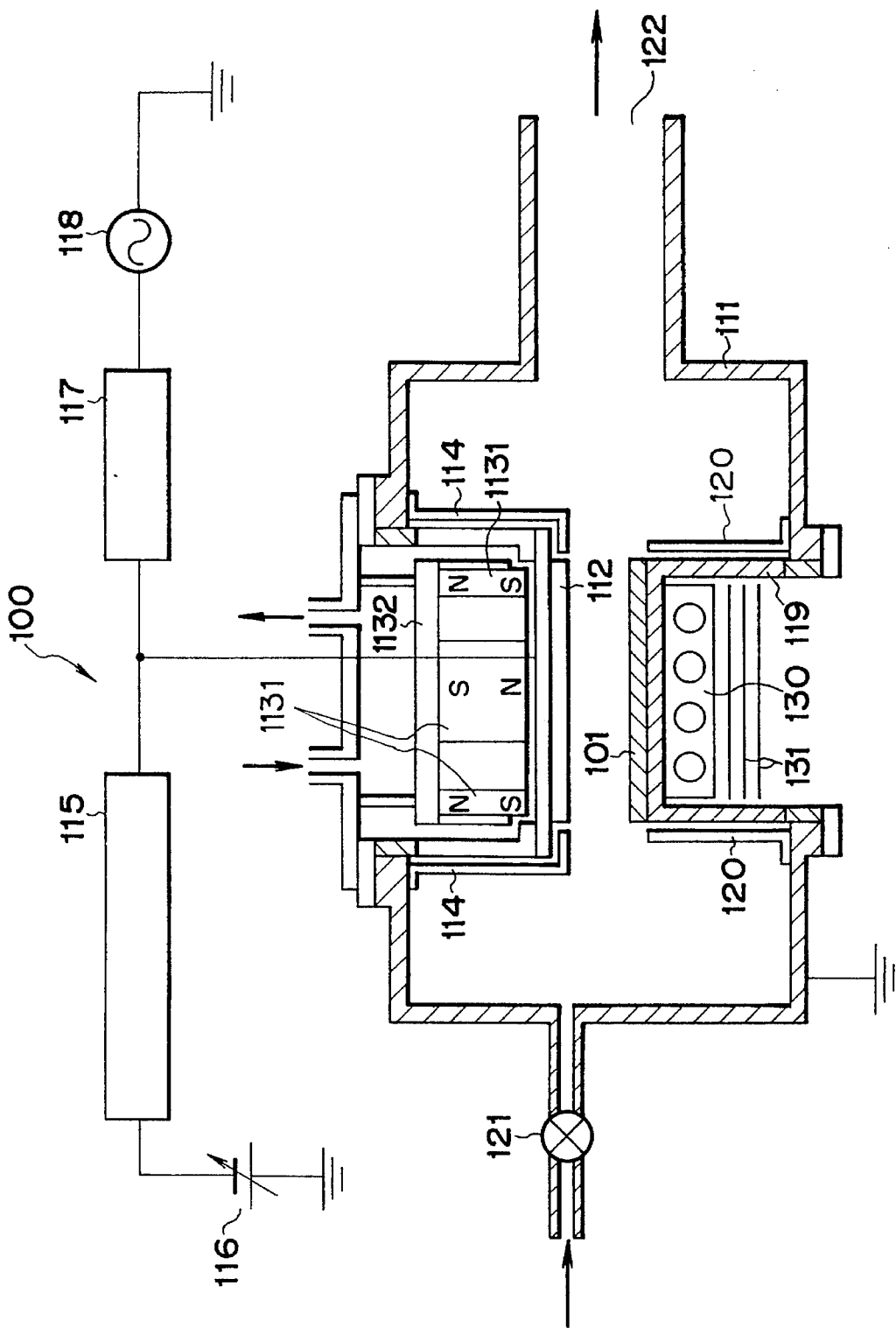
FIG. 3 illustrates a film-forming sputtering apparatus provided with a conventional substrate-heating mechanism.

Comparison experiments were conducted where silicon films were formed on a substrate respectively by means of a film-forming sputtering apparatus 10, and 50 shown in FIGS. 1 and 2 and a conventional film-forming sputtering apparatus 100 shown in FIG. 3. The impurities in the formed films were measured by SIM. The results are described below.

The film formation conditions in the comparison experiments are shown in Table 1.

TABLE 1

| Film Formation Conditions | |
|---|---|
| Item | Conditions |
| Discharge frequency | 100 MHz |
| Discharge power | 100 W |
| Target DC potential | −200 V |
| Discharge pressure | 8 mtorr |
| Substrate temperature | 600° C. |
| Substrate | Si wafer (CZ method) |
| Target material | Si (CZ method) |

The comparison results are shown in Table 2.

TABLE 2

| | Comparison Results | |
|---|---|---|
| Element | System of the present invention (Atoms/cm$^3$) | Conventional system (Atoms/cm$^3$) |
| C (Carbon) | $8.0 \times 10^{17}$ | $1.2 \times 10^{19}$ |
| O (Oxygen) | $9.1 \times 10^{17}$ | $1.1 \times 10^{19}$ |
| N (Nitrogen) | $1.0 \times 10^{17}$ | $1.9 \times 10^{18}$ |

From the results shown in Table 2, the film-forming sputtering apparatuses 10, 50 gave less contamination, by one or more decimal units, of the formed silicon film with carbon and oxygen than the conventional film forming sputtering apparatus 100. Thus it has been confirmed that the contamination is decreased by the present invention.

The present invention is described specifically by reference to examples. The present invention is not limited thereto, but naturally includes various modification within the scope of the gist of the invention.

The above description are made regarding a film-forming sputtering apparatus which is the background of the present invention. However the present invention is not limited thereto, and is also applicable not only to the substrate-heating mechanism of plasma CVD systems but generally to substrate-heating mechanisms of other apparatuses in which a substrate is heat-treated in vacuo.

The substrate-heating mechanism of the present invention comprises a second vacuum chamber for keeping vacuum a face of a substrate reverse to a film formation face, whereby a released gas from a substrate heating mechanism is emitted in the second vacuum chamber and exhausted therefrom to the outside. Accordingly, the released gas does not diffuse into a first vacuum chamber in which a film is formed, and contamination of the formed film with the released gas is prevented.

Further, the cooling means for cooling a substrate holder enables cooling of the substrate holder in the vicinity of substrate-heating source, thereby decreasing the amount of the released gas caused by temperature rise of the substrate holder.

Even when the substrate-heating source is a light source provided outside the second vacuum chamber and projects light through a light-introducing window onto a substrate face reverse to a film formation face, film deposition on the light-introducing window is prevented, resulting in efficient heating.

What is claimed is:

1. A film-forming apparatus comprising:

a first vacuum chamber connected to a gas introducing conduit for introducing a gas into the first vacuum chamber and to a first evacuating means for vacuum evacuating the chamber and having therein a substrate held by a substrate holder and a plasma region including a film-forming region of the substrate;

a second vacuum chamber connected to a second evacuating means for vacuum evacuating the second vacuum chamber and having a region including a surface of the substrate opposite to the film-forming region, a heating means for heating the opposite surface and a cooling means for cooling the substrate holder; and means for lowering the inner pressures of the first and the second vacuum chambers to below $1.0 \times 10^{-8}$ Torr by the first and the second evacuating means at the same time of plasma generation in the first vacuum chamber and heating by the heating means, cooling the substrate holder by the cooling means, and introducing a gas from the gas introducing conduit into the first vacuum chamber in the order mentioned.

2. A film-forming apparatus comprising:

a first vacuum chamber connected to a gas introducing conduit for introducing a gas into the first vacuum chamber and to a first evacuating means for vacuum evacuating the chamber and having therein a substrate held by a substrate holder and a plasma region including a film-forming region of the substrate;

a second vacuum chamber connected to a second evacuating means for vacuum evacuating the second vacuum chamber and having a cooling means for cooling the substrate holder;

a heating means provided outside the first and the second vacuum chambers and having a light source for heating a surface of the substrate opposite to the film-forming region; and means for lowering the inner pressures of the first and the second vacuum chambers to below $1.0 \times 10^{-8}$ Torr by the first and the second evacuating means at the same time of plasma generation in the first vacuum chamber and heating by the heating means, cooling the substrate holder by the cooling means, and introducing a gas from the gas introducing conduit into the first vacuum chamber in the order mentioned.

3. A method for preparing a deposited film prepared by a film-forming apparatus comprising a first vacuum chamber connected to a gas introducing conduit for introducing a gas into the first vacuum chamber and to a first evacuating means for vacuum evacuating the chamber and having therein a substrate held by a substrate holder and a plasma region including a film-forming region of the substrate, and a second vacuum chamber connected to a second evacuating means for vacuum evacuating the second vacuum chamber and having a region including a surface of the substrate opposite to the film-forming region, a heating means for heating the opposite surface and a cooling means for cooling the substrate holder, comprising the steps of:

lowering the inner pressures of the first and the second vacuum chambers to below $0.10 \times 10^{-8}$ Torr by the first and the second evacuating means at the same time of plasma generation in the first vacuum chamber and heating by the heating means;

cooling the substrate holder by the cooling means;

introducing a gas from the gas introducing conduit into the first vacuum chamber.

4. A method for preparing a deposited film prepared by a film-forming apparatus comprising a first vacuum chamber connected to a gas introducing conduit for introducing a gas into the first vacuum chamber and to a first evacuating means for vacuum evacuating the chamber and having therein a substrate held by a substrate holder and a plasma region including a film-forming region of the substrate, and a second vacuum chamber connected to a second evacuating means for vacuum evacuating the second vacuum chamber and having a cooling means for cooling the substrate holder, and a heating means provided outside the first and the second vacuum chambers and having a light source for heating a surface of the substrate opposite to the film-forming region, comprising the steps of:

lowering the inner pressures of the first and the second vacuum chambers to below $1.0 \times 10^{-8}$ torr by the first and the second evacuating means at the same time of plasma generation in the first vacuum chamber and heating by the heating means;

cooling the substrate holder by the cooling means; and introducing a gas from the gas introducing conduit into the first vacuum chamber.

\* \* \* \* \*

UNITED STATES PATENT AND TRADEMARK OFFICE
CERTIFICATE OF CORRECTION

PATENT NO. : 5,478,609

DATED : December 26, 1995

INVENTORS : NOBUYUKI OKAMURA

It is certified that error appears in the above-identified patent and that said Letters Patent is hereby corrected as shown below:

ON TITLE PAGE

In [57] ABSTRACT: line 6, "vacuum the" should read --vacuum on the--.

COLUMN 1

Line 10, "a" should be deleted.

COLUMN 2

Line 14, "disadvantages" should read --disadvantageous--.
Line 36, "keeping vacuum" should read --maintaining vacuum on--.
Line 50, "illustrates roughly" should read --roughly illustrates--.
Line 53, "illustrates roughly" should read --roughly illustrates--.

UNITED STATES PATENT AND TRADEMARK OFFICE
CERTIFICATE OF CORRECTION

PATENT NO. : 5,478,609

DATED : December 26, 1995

INVENTORS : NOBUYUKI OKAMURA

It is certified that error appears in the above-identified patent and that said Letters Patent is hereby corrected as shown below:

COLUMN 3

Line 32, "illustrates roughly" should read --roughly illustrates--.

COLUMN 5

Line 59, "keeping vacuum" should read --maintaining vacuum on--.

COLUMN 7

Line 5, "0.10x10$^{-8}$Torr" should read --1.0x10$^{-8}$ Torr--.
Line 9, "means;" should read --means; and--.

COLUMN 8

Line 10, "1.0x10$^{-8}$ torr" should read --1.0x10$^{-8}$ Torr--.

Signed and Sealed this

Seventh Day of May, 1996

Attest:

BRUCE LEHMAN

*Attesting Officer*    Commissioner of Patents and Trademarks